United States Patent [19]

Yamamoto

[11] Patent Number: 4,695,828
[45] Date of Patent: Sep. 22, 1987

[54] ELECTRONIC APPARATUS FOR ENTERING PATTERN DATA BY FINGER ACTIVATION

[75] Inventor: Haruo Yamamoto, Sayama, Japan

[73] Assignee: Casio Computer Co., Ltd., Tokyo, Japan

[21] Appl. No.: 514,312

[22] Filed: Jul. 15, 1983

[30] Foreign Application Priority Data

Jul. 23, 1982 [JP] Japan .................. 57-128614

[51] Int. Cl.[4] .............................................. G06F 3/02
[52] U.S. Cl. ........................... 340/365 S; 340/365 R; 382/9; 382/10; 382/13
[58] Field of Search ............ 340/365 S, 365 A, 365 P, 340/365 R, 365 C, 711, 791; 364/709, 712; 382/9, 10, 13

[56] References Cited

U.S. PATENT DOCUMENTS

| | | | |
|---|---|---|---|
| 3,617,722 | 11/1971 | Grosky | 340/365 S |
| 3,996,557 | 12/1976 | Donahey | 382/13 |
| 4,005,400 | 1/1977 | Engdahl | 382/13 |
| 4,024,500 | 5/1977 | Herbst et al. | 382/9 |
| 4,028,661 | 6/1977 | Mortimer | 340/365 S |
| 4,047,010 | 9/1977 | Perotto et al. | 382/13 |
| 4,070,649 | 1/1978 | Wright, Jr. et al. | 382/13 |
| 4,139,837 | 2/1979 | Liljenwall et al. | 382/13 |
| 4,199,751 | 4/1980 | Piguet | 340/365 S |
| 4,232,290 | 11/1980 | Yasuda et al. | 382/13 |
| 4,354,246 | 10/1982 | Fujisawa | 364/709 |
| 4,420,750 | 12/1983 | Okabayashi | 340/791 |
| 4,424,567 | 1/1984 | Yasutake | 364/709 |
| 4,477,797 | 10/1984 | Nakagiri | 340/365 S |
| 4,502,038 | 2/1985 | Lowenthal et al. | 340/365 S |
| 4,502,039 | 2/1985 | Vercesi et al. | 340/365 S |

FOREIGN PATENT DOCUMENTS

| | | | |
|---|---|---|---|
| 50-152621 | 12/1975 | Japan . | |
| 55-82335 | 6/1980 | Japan . | |
| 57-128 | 5/1981 | Japan | 340/365 S |

Primary Examiner—John W. Caldwell, Sr.
Assistant Examiner—Mahmoud Fatahi-Yar
Attorney, Agent, or Firm—Frishauf, Holtz, Goodman & Woodward

[57] ABSTRACT

An electronic apparatus for entering pattern data by activating a matrix array of keys with a finger. Pattern data may be input by drawing a pattern data on the keys. The time interval between depression of one key till the depression of a different key while a pattern data is being drawn, is measured by a register. The time interval being measured is symbolically displayed on a display section. Time data representing the time interval being measured is compared with a reference time interval in a comparator. When the coincidence of the two data being compared is detected, the pattern data that has been input by drawing the pattern is displayed on the display section.

7 Claims, 8 Drawing Figures

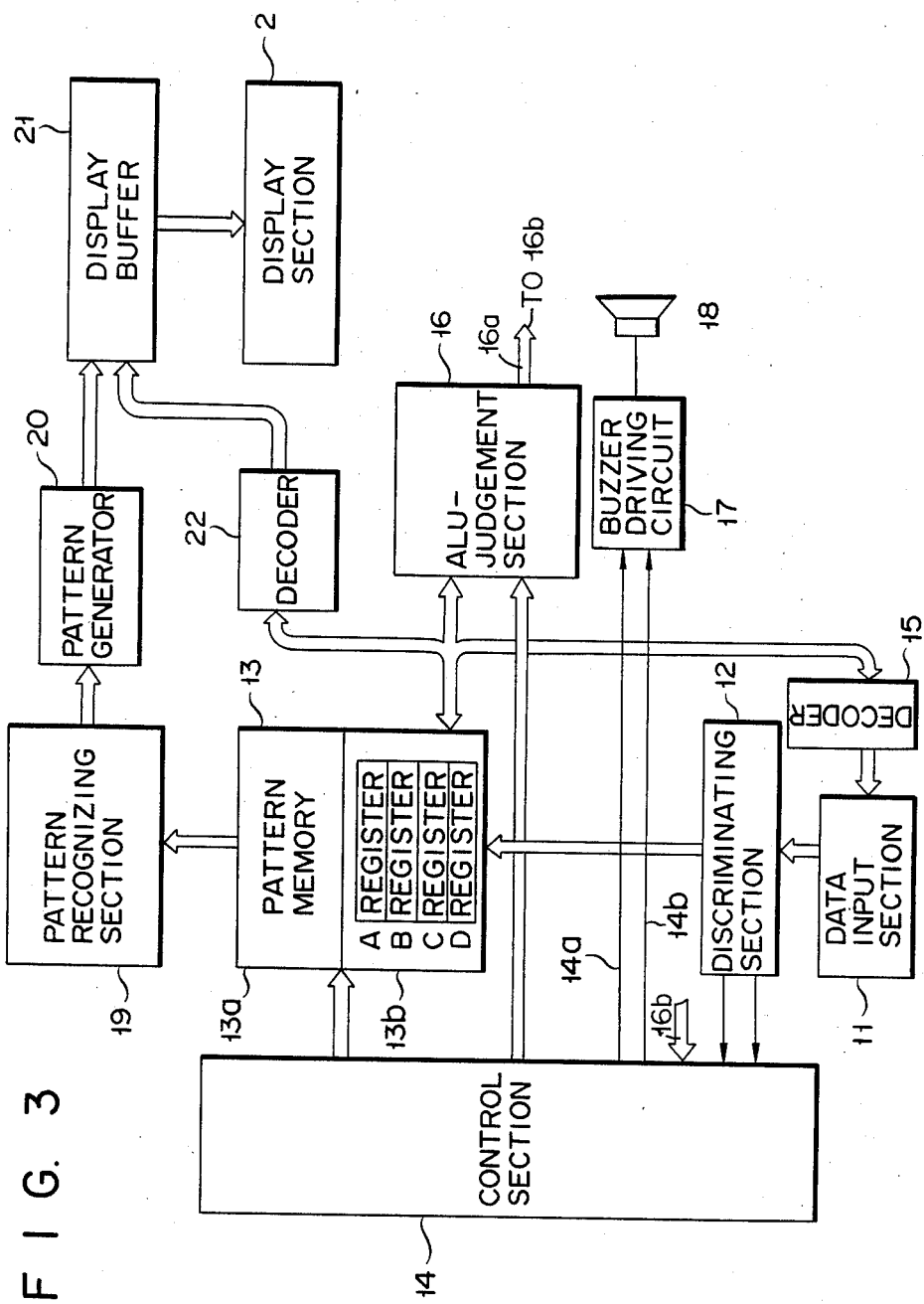
F I G. 3

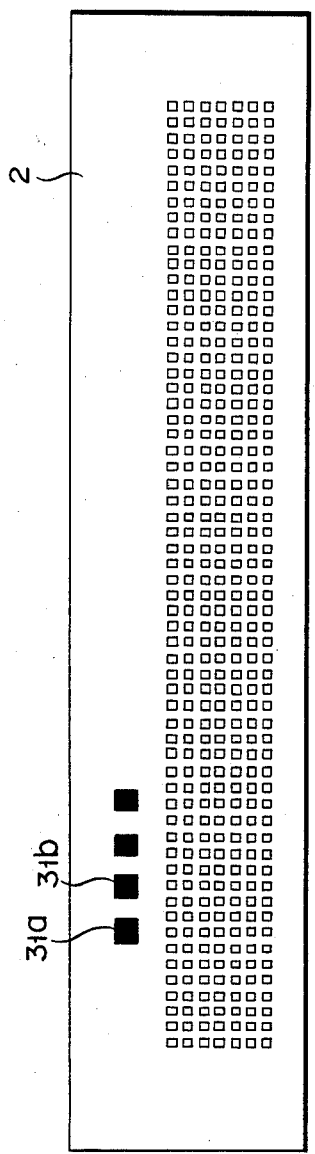

ELECTRONIC APPARATUS FOR ENTERING PATTERN DATA BY FINGER ACTIVATION

BACKGROUND OF THE INVENTION

This invention relates to an electronic apparatus for entering pattern data by activating a matrix array of keys with a finger.

An electronic apparatus, which has keys arranged as a matrix array on a keyboard and capable of providing co-ordinate data of the key position as these keys are pushed for entering a pattern, is well known in the art.

In this type of electronic apparatus, pattern data are input with an inter-pattern time interval provided between consecutive unit pattern data. Usually, the inter-pattern time interval is provided by operating an inter-pattern time interval key on the keyboard after the completion of input of one unit pattern data and before the start of input of the next unit pattern data. Other known apparatus are provided with means which permits a desired inter-pattern time interval to be set by the operator.

In the former case, the extra key for providing the inter-pattern time interval must be provided and operated every time the input of one unit pattern data is completed, which is undesirable from the standpoint of the simplicity of the pattern data input operation. In the latter case, the inter-pattern time interval is determined solely by the operator. In this case, therefore, the inter-pattern time interval may be too short or too long in view of the pattern drawing speed. If a unit pattern consisting of a plurality of strokes is traced too slowly, it may cause an inter-stroke time interval between consecutive strokes to be longer than the interpattern time interval so that it is erroneously recognized as an inter-pattern time interval. On the other hand, if patterns are traced too quickly, an interpattern time interval between consecutive unit patterns is liable to be erroneously recognized as an inter-stroke time interval that is, two unit patterns are liable to be erroneously recognized as a single unit pattern.

SUMMARY OF THE INVENTION

An object of the invention is to provide an electronic apparatus capable of pattern data input, which can overcome the deficiencies described above and which can symbolically display on a display section interpattern time intervals between consecutive unit patterns and the lapse of time so that the pattern data may be input while the input data are being checked.

To attain the above object of the invention, there is provided an electronic apparatus for entering pattern data by activating a matrix array of keys with a finger, which comprises pattern data input means having matrix array keys, means connected to the pattern data input means for detecting the "on"-"off" state of the keys, means connected to the "on"-"off" state detecting means for measuring the time interval from the release of a key in the pattern data input means till the depression of a different key, time interval display means connected to the time interval measuring means and having display elements driven according to a time interval during the measuring thereof to display the time interval, comparing means connected to the time interval measuring means for comparing the data from the time interval measuring means and a reference time interval, and pattern recognizing means connected between the time interval measuring means and time interval display means for causing the time interval display means to display pattern data entered with a finger when the comparing means detects a coincidence of the time interval data and reference time interval.

BRIEF DESCRIPTION OF THE DRAWINGS

FIG. 3 is a block circuit diagram showing the embodiment;

FIG. 8 is a front view of a display section in a different embodiment of the invention.

DETAILED DESCRIPTION OF THE PREFERRED EMBODIMENT

Figure 1:
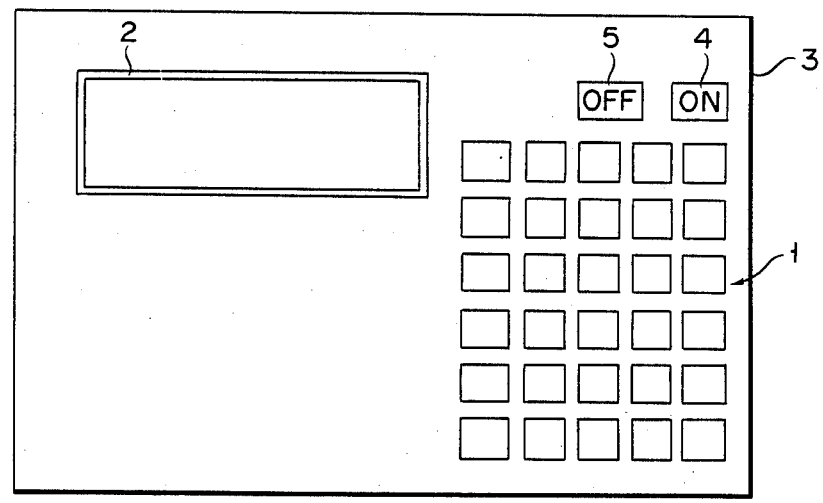
FIG. 1 is a front view of a miniaturized electronic apparatus with a matrix array of keys pertaining to the invention.

An embodiment of the invention will now be described with reference to the drawings. FIG. 1 shows a miniaturized electronic apparatus embodying the invention. It has keys 1 arranged in a matrix array on its case 3. The case 3 also has a display section 2, a power "on" key 4 and a power "off" key 5. The matrix array keys 1 may be depressed with a finger drawing a pattern to thereby provide co-ordinate data representing their position in the matrix array.

Figure 2:
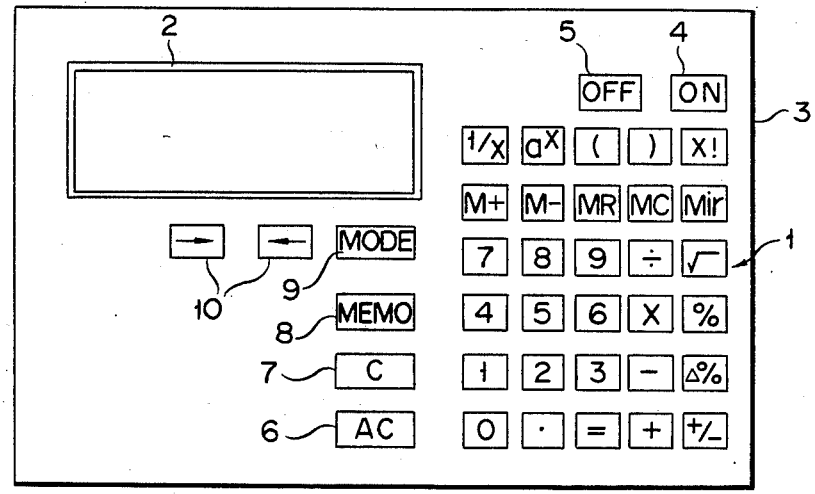
FIG. 2 is a front view of an embodiment of the invention applied to a miniaturized electronic calculator.

FIG. 2 shows an embodiment of the invention applied to a miniaturized electronic calculator. Referring to the figure, keys 1 provided on a case 3 include numeral keys and function keys. These keys are arranged in a matrix array, i.e., in 5 columns and 6 rows, and form a pattern data input section for inputting data of patterns drawing on them. The case 3 further has a power "on" key 4, a power "off" key 5, an "AC" key 6, a "C" key 7, a "MEMO" key 8, a mode selection key 9 and "→" and "←" keys 10 for reading data out of an electronic memory. The mode selection key 9 is operable to select a first or second mode. The first mode is an ordinary arithmetic operation mode. In this mode, the individual keys in the key matrix array, i.e., the numeral keys and function keys, provide their primary key data input functions when they are turned on. The second mode is a pattern data input mode. In this mode, pattern data can be input as corresponding patterns are drawn on the 5-column, 6-row key matrix array with a finger. The patterns, the data of which can be input by drawing them, include numeral FIGS. 0 to 9, alphabet letters A to Z, arithmetic operation symbols +. −, × and ÷ etc. These patterns can be displayed on the display section 2 when their data is input. When the "MEMO" key 8 is depressed, the displayed pattern data is memorized in an electronic memory. Arithmetic operations may be performed on pattern data input in the manner as described, e.g., data "5+2=".

The case 3 accommodates an electronic circuit, which will now be described with reference to the block diagram of FIG. 3. The Figure illustrates only parts of the circuit that concern the pattern data input and recognition sections of the circuit that function to perform arithmetic operations and data storing. The circuit includes a data input section 11, which can generate data according to the operation of the matrix array keys 1 shown in FIG. 1. In the arithmetic operation mode, the section 11 generates codes representing the primary or intrinsic functions of keys. In the pattern data input mode, it generates co-ordinate data representing the positions of keys 1 that are turned on. The co-ordinate data from the section 11 are fed through a discriminating section 12 to a memory section 13. The discriminating section 12 checks to see whether the input signal is co-ordinate data, that is, whether it is an "off" or "on" key signal. It feeds an "off" or "on" key signal to a control section 14. The memory section 13 includes a pattern memory 13a storing the input pattern data, and a register section 13b which has A to D registers. The control section 14 controls the writing and reading data from the memory section 13. The A to C registers are provided to display the inter-pattern time interval from the completion of input of one unit pattern data for a digit on the display section 2 till the start of input of the unit pattern data for the next digit. Digit data representing the digit place at which to display input data is stored in the A register. An inter-pattern time interval data is displayed, for instance, in the first digit place if the data A in the A register is "1" and in the 8th digit place if the data A is "8". Subsequent to the display of the time interval data, recognized pattern data is displayed. A cursor display may be obtained using this A register, but this is omitted in this embodiment. Data of the number B of dot rows in the 5×7 dots that are to be displayed in the digit place specified by the A register is stored in the B register. If B=7, all the seven dot rows are displayed. If B=1, only the lowermost dot row is displayed. The C register is a counter for controlling the dot "on" time. The D register is a counter for counting key data sampling signals. The data in the D register is fed to a decoder 15. The decoded data is the key data sampling signal which is fed to the data input section 11. The data in the register section 13b is read out into an arithmetic operation/judgement section 16. The section 16 also receives predetermined numeral code data from the control section 14, and performs arithmetic operations on both input data. It also performs judgement of the results of the arithmetic operations; it detects the presence or absence of data, presence or absence of carry signal, etc. The results of this judgement are fed to the control section 14 over lines 16a and 16b. The flow of operations of the arithmetic operation/judgement section 16 will be described later in detail with reference to FIG. 6. The control section 14 performs predetermined control operations according to data from the discriminating section 12 and arithmetic operation/judgement section 16. It feeds a drive signal to a buzzer driving circuit 17 through signal lines 14a and 14b.

Figure 4:
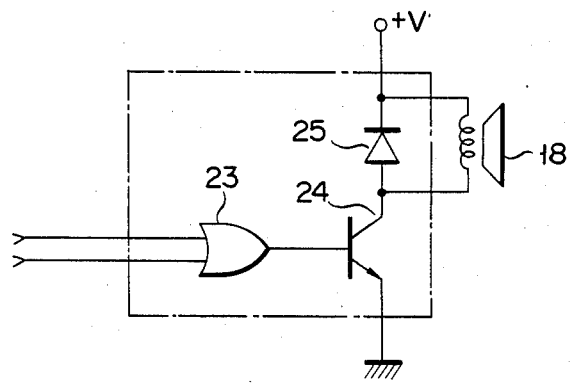
FIG. 4 is a circuit diagram of a buzzer driving circuit shown in FIG. 3.

As shown in FIG. 4, the buzzer driving circuit 17 includes an OR gate 23, a transistor 24 having the base connected to the output terminal of OR gate 23 and a diode 25 connected to the collector of transistor 24. A loudspeaker 18 can be driven by drive signals supplied from the control section 14 through respective lines 14a and 14b and can produce buzzer sounds at two different frequencies. The pattern data fed to the pattern memory 13a is transferred to a pattern recognizing section 19, which recognizes the pattern represented by the pattern data. The recognized pattern data output is fed to a pattern generator 20 for conversion to pattern data.

Figure 5:
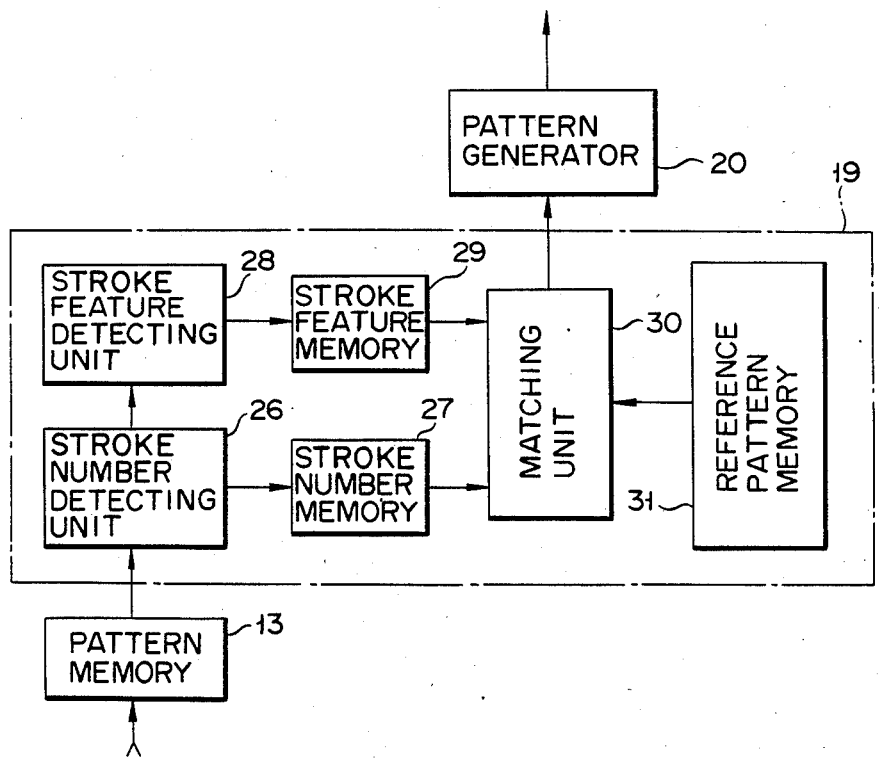
FIG. 5 is a block diagram of a pattern recognizing section shown in FIG. 3.

FIG. 5 shows a specific construction of the pattern recognizing section 19. It includes a stroke number detecting unit 26, which receives the output from the pattern memory 13a and detects the stroke number from the received data. The stroke number data detected is written in a stroke number memory 27. It is also fed to a stroke feature detecting unit 28, which feeds detected stroke feature data to a stroke feature memory 29 to be stored therein. The data read out from the stroke number memory 27 and stroke feature memory 29 are compared by a matching unit 30 with reference pattern data from a reference pattern memory 31. The output data of the matching unit 30 is coupled as pattern signal to the display section 2 through the pattern generator 20.

A decoder 22 decodes the data in the B register of register section 13b, and its output is fed to a display buffer 21. The data, which is coupled through the decoder 22 to the display buffer 21, represents the inter-pattern time interval between two consecutive continuous pieces of pattern data input.

Figure 6:
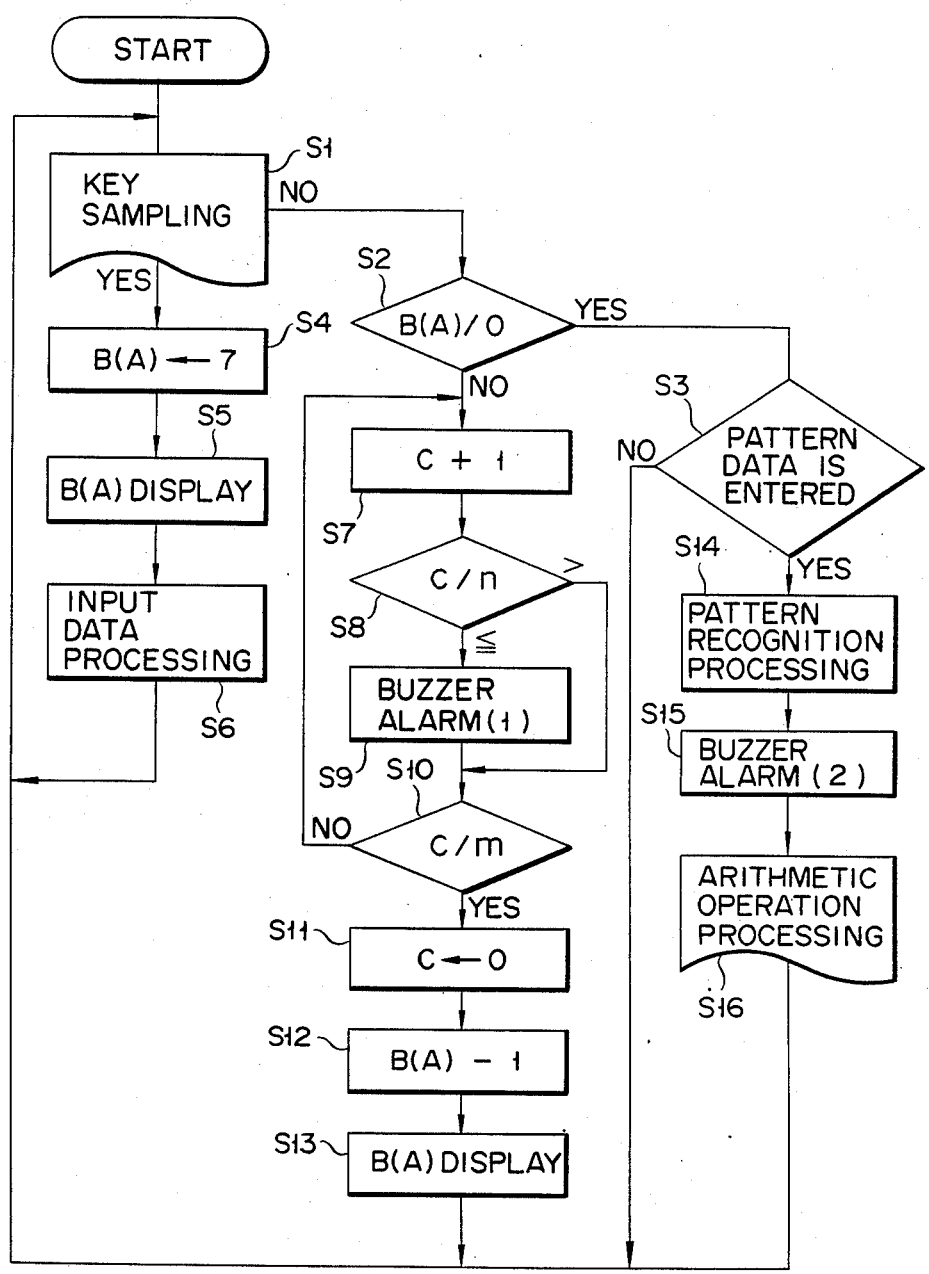
FIG. 6 is a flow chart illustrating the operation of the circuit of FIG. 3.
Figure 7:
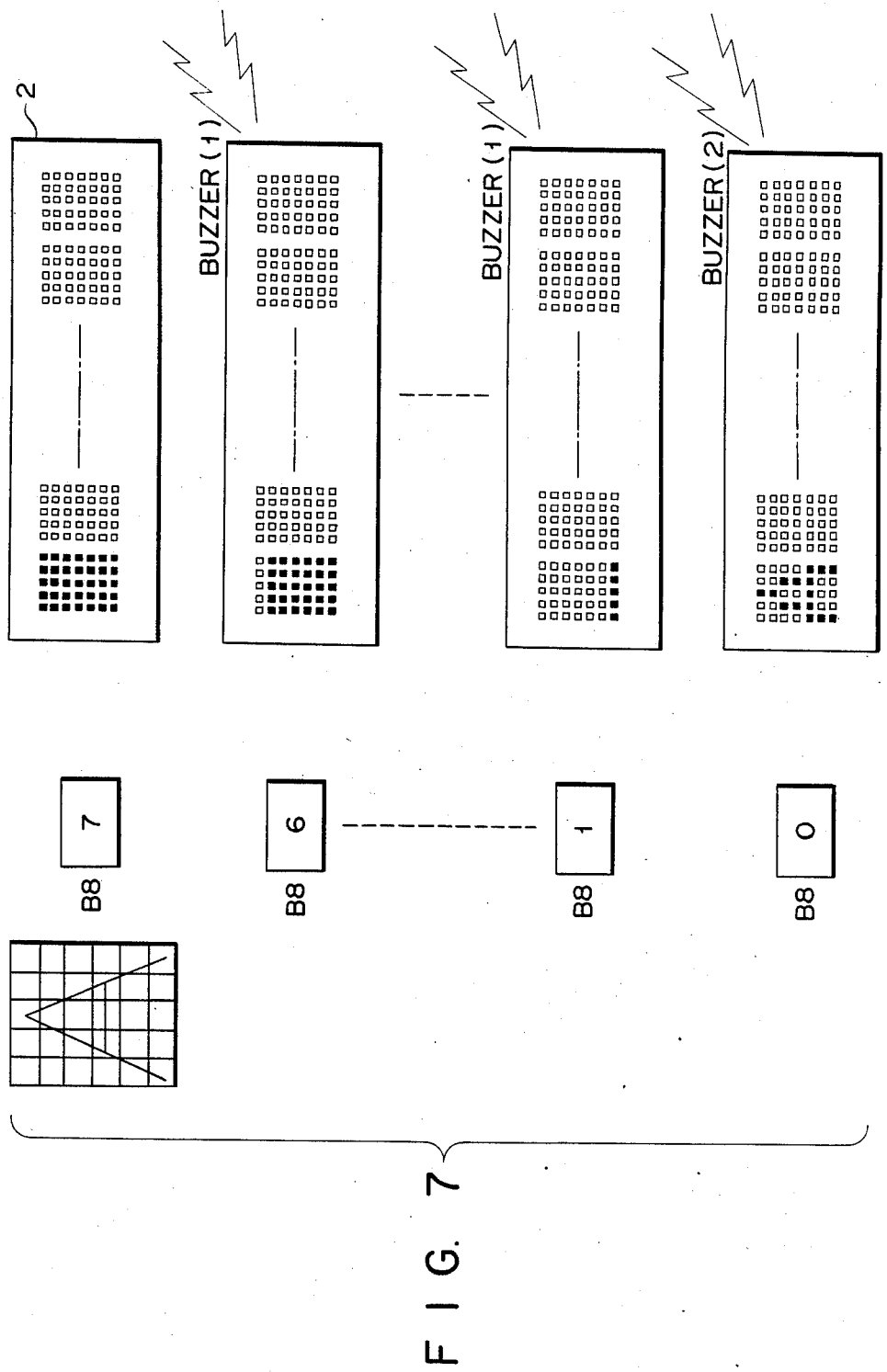
FIG. 7 illustrates how to display the inter-pattern time interval on a display section shown in FIG. 3, the relation between the displayed inter-pattern time interval and a preset time interval set in a register and the way, in which recognized pattern data is displayed after the lapse of the preset time interval.

The operation of the above construction in the pattern data input mode will now be described with reference to the flow chart of FIG. 6. The D register in the register section 13b, i.e., key data sampling signal counter, is up-counting signal at all time with a predetermined controlled timing. Its count is decoded in the decoder 15, and the output thereof is fed as key data sampling signal to the data input section 11. The discriminating section 12 checks whether the input data is an "off" or "on" key data. The result of discrimination is fed to the control section 14. It is checked as to whether the key data is an "off" or "on" signal in step $S_1$ in the routine of operation in this mode, as shown in FIG. 6. When the checked data is an "off" key data, the routine goes to step $S_2$, in which whether the content B(A) in the B register corresponding to the digit represented by the data in the A register in the register section 13b is "0" is checked. When it is "0", step $S_3$ is executed. It checks whether there is any pattern data. When no pattern data is detected, the routine goes back to step $S_1$. It will be seen that while any "on" key data has not been input yet, the system is in a stand-by state, in which steps $S_1$ through $S_3$ are executed repeatedly. It is now assumed that an operation of inputting pattern data of, for instance, an alphabet letter "A" is started. The input "on" key data is detected in step $S_1$, so that the routine goes to step $S_4$. In step $S_4$ data of a numeral "7" which represents the number of dot rows is provided from the control section 14 and written in the B register in a given digit place area thereof, for instance the 8th digit (most significant) digit place area $B_8$ as specified by the digit place data in the A register. The routine then goes to a step $S_5$, in which the data "7" in the digit place area $B_8$ of B register is read out through the decoder 22 into the display buffer 21 and displayed on the display section 2. In this case, all the dots in the 8th digit place (i.e., the leftmost position) are energized and displayed as shown in FIG. 7. The routine then goes to step $S_6$, in which the input data is written into the pattern memory 13a. The routine then returns to step $S_1$. While a continuous portion or stroke of a given pattern drawn on the key matrix array surface, that is, while the "on" key data for this stroke are being input successively and continuously, steps $S_4$ through $S_6$ are repeatedly executed. When the drawing is completed, any "on" key data is no longer detected. As a result, the routine goes from step $S_1$ to step $S_2$ for the check as to whether the content B(A) in the B register, in the instant case the dot row number data in the 8th digit place area of the B register, is "0". Since the data in the 8th digit place area is not "0", the answer is NO in step $S_2$. Consequently, the routine goes to step $S_7$, in which the data of the C register, which is the dot "on" time control counter, is incremented by "+1". Then step $S_8$ is executed, in which the data C in the C register and a value n which corresponds to the buzzer driving time are compared. When it is detected that $C \leq n$, subsequent step $S_9$ is executed, in which a drive signal is supplied from the control section 14 through the signal line 14a to the buzzer driving circuit 17, whereby the loudspeaker 18 is driven at a frequency $f_1$. The routine then goes to step $S_{10}$, in which the data D in the C register is compared with a preset value m, which is, for instance, "n+1". When the value m has not been reached by the data C yet, the routine returns to the step $S_7$. Steps $S_7$ through $S_{10}$ are repeatedly executed until it is detected that $C > n$. Until this instant, the buzzer alarm has been given. When it is detected in step $S_8$ that $C > n$, the following routine jumps buzzer driving step $S_9$ so that buzzer alarm is no longer produced. In this instance, step $S_{10}$, to which the routine has been jumped from step $S_8$, yields NO since the condition $C < m$ still holds. The routine thus returns to step $S_7$ for the operation "C+1". In the following routine step $S_{10}$ that is executed immediately after step $S_8$ yields YES for the data C in the D register is equal to m at this time. The routine now goes to step $S_{11}$, in which the data in the C register is cleared. In subsequent step $S_{12}$, an operation "B(A)−1", in the instant case an operation "7−1=6", is performed. The resultant data in the area $B_8$ of B register is fed through the decoder 22 to the display buffer 21. Step $S_{13}$ is then executed, in which the data in the display buffer 21 is displayed. In the instant case the data transferred from the display buffer 21 is $B_8=6$, so that the dots in the lower 6 dot rows in the 8th digit of the display section 2 are energized and displayed. The routine then returns to step $S_1$ in which the input data is checked. If no pattern data is being input at this moment, the same operation as described before is performed, with the display dots in the pertinent display digit of the display section 2 being reduced by one dot row and buzzer alarm produced for every predetermined time interval. If a new pattern data input operation has been started before the data B(A) in the B register becomes "0", the routine goes from step $S_1$ to step $S_4$ to execute the operation as described above. If no pattern data input operation has been started again until the instant noted above, it is determined that the pattern data input operation for one unit pattern, i.e., one digit, has been completed. Consequently, the routine goes from step $S_1$ through step $S_2$ to step $S_3$. In step $S_3$ a check as to whether there is pattern data stored in the pattern memory 13a is done as noted previously. Since there is stored pattern data at this instant, the routine goes to step $S_{14}$, in which the stored pattern data is transferred to the pattern recognizing section 19, and is recognized therein. The recognized pattern data of the section 19 is fed to the dot drive signal generator 20 for conversion to a dot drive signal, which is fed to the display buffer 21. The input pattern "A" is thus displayed as a pertinent digit as shown in FIG. 7. When the recognition of the input pattern data is completed, the routine goes to step $S_{15}$, in which a buzzer drive signal is supplied from the control section 14 to the signal line 14b to the buzzer driving circuit 17. The buzzer 18 is now driven at a different frequency $f_2$, indicating that a predetermined time has been passed. Step $S_{16}$ is subsequently executed, in which the data of the pattern recognizing section 19 is transferred to an arithmetic circuit (not shown) for relevant arithmetic operations. As the pattern data for successive digits are input by tracing given patterns over surface of the key matrix array, they are progressively displayed on the display section 2 and are also transferred to the arithmetic circuit in the manner as described.

In the above embodiment the buzzer was driven during the dot "on" period. Alternatively, the buzzer may be driven every time the "on" dot are reduced by one row. Further, the buzzer may be dispensed with, and only the time interval between two successive digit pattern data input operations may be shown on the display section. Further, display members 31a, 31b, 31c, 31d as shown in FIG. 8 may be separately provided for the confirmation of the time interval between consecutive pattern data input operations such that they are all energized together in response to the commencement of a pattern data input operation and de-energized in sucession, one display member for each time interval.

What is claimed is:

1. An electronic apparatus for entering a pattern data by activating a matrix array of keys with a finger comprising:
    pattern data input means having matrix array keys;
    means connected to said pattern data input means for detecting the "on"-"off" state of said keys;
    means having an input connected to said "on"-"off" state detecting means, for measuring a time interval beginning from the release of a key in the pattern data input means and ending at the depression of a different key therein;
    means connected to said time interval measuring means and having a display means driven according to the measured time interval for providing a display indicative thereof;
    means for storing a reference time interval signal;
    means connected to said time interval measuring means and said storing means, for comparing a signal from said time interval measuring means and said reference time interval signal from said storing means;
    pattern recognition in means coupled between said time interval measuring means and said display means, for causing said display means to display input pattern data entered with a finger when said comparing means detects the coincidence of said measured time interval signal and said reference time interval signal.

2. The electronic apparatus according to claim 1, wherein said pattern data input means comprises a mode selection switch means for selecting between an arithmetic operation mode and a pattern data input mode.

3. The electronic apparatus according to claim 1, further including means for generating sound.

4. The electronic apparatus according to claim 3, wherein said sound generating means generates sound every time said time interval measuring means renews the time measurement.

5. The electronic apparatus according to claim 3, wherein said sound generating means generates sound when the time measurement of said time interval measurement means reaches a preset value.

6. The electronic apparatus according to claim 1, wherein said time interval display means displays both the recognized pattern and the time interval.

7. The electronic apparatus according to claim 1, wherein said time interval display means displays a plurality of digits each consisting of display elements arranged in n columns and m rows, all said display elements being energized together in response to the commencement of a data input operation, and deenergized, row by row, at preset times during said time interval.

* * * * *